(12) United States Patent
Hirano et al.

(10) Patent No.: US 11,004,193 B2
(45) Date of Patent: May 11, 2021

(54) INSPECTION METHOD AND INSPECTION APPARATUS

(71) Applicant: NuFlare Technology, Inc., Yokohama (JP)

(72) Inventors: Ryoichi Hirano, Setagaya-ku (JP); Hideo Tsuchiya, Setagaya-ku (JP); Masataka Shiratsuchi, Kawasaki (JP); Hideaki Hashimoto, Yokohama (JP); Riki Ogawa, Kawasaki (JP)

(73) Assignee: NuFlare Technology, Inc., Yokohama (JP)

( * ) Notice: Subject to any disclaimer, the term of this patent is extended or adjusted under 35 U.S.C. 154(b) by 56 days.

(21) Appl. No.: 16/237,770

(22) Filed: Jan. 2, 2019

(65) Prior Publication Data
US 2019/0213726 A1 Jul. 11, 2019

(30) Foreign Application Priority Data
Jan. 11, 2018 (JP) .............................. JP2018-002386

(51) Int. Cl.
*G06T 7/00* (2017.01)
*G01N 21/956* (2006.01)
(Continued)

(52) U.S. Cl.
CPC ......... *G06T 7/001* (2013.01); *G01N 21/8851* (2013.01); *G01N 21/95607* (2013.01); *G03F 7/7065* (2013.01); *G06T 2207/30148* (2013.01)

(58) Field of Classification Search
CPC .......... G06T 7/001; G06T 2207/30148; G06T 5/006; G06T 2207/10008;
(Continued)

(56) References Cited

U.S. PATENT DOCUMENTS 6,169,603 B1 * 1/2001 Takayama ............. G03F 7/7075
356/500
6,587,581 B1 * 7/2003 Matsuyama ....... G01N 21/8851
250/305
(Continued)

FOREIGN PATENT DOCUMENTS

JP 2013-246162 12/2013
JP 2017-83301 A 5/2017
(Continued)

OTHER PUBLICATIONS

Korean Office Action dated Feb. 26, 2020 in Korean Patent Application No. 10-2019-0002886 (with English translation), 14 pages.
(Continued)

*Primary Examiner* — Nimesh Patel
(74) *Attorney, Agent, or Firm* — Oblon, McClelland, Maier & Neustadt, L.L.P.

(57) ABSTRACT

There is provided an inspection method including acquiring an inspection image by irradiating a sample with a plurality of electron beams and by simultaneously scanning the sample by the electron beams, performing first correction of a reference image corresponding to the inspection image or second correction of the inspection image based on a plurality of distortions of each of the electron beams and on a position scanned by each of the electron beams in the inspection image, and performing first comparison of the reference image subjected to the first correction with the inspection image or second comparison of the reference image with the inspection image subjected to the second correction.

12 Claims, 9 Drawing Sheets

(51) Int. Cl.
*G03F 7/20* (2006.01)
*G01N 21/88* (2006.01)

(58) Field of Classification Search
CPC . G06T 2207/10024; G06T 2207/20012; G06T 2207/20192; G06T 5/002; G06T 5/003; G06T 5/20; G06T 2200/24; G06T 2200/32; G06T 2207/10016; G06T 2207/30041; G06T 2207/30168; G06T 3/4038; G06T 5/50; G06T 7/0012; G06T 7/337; G06T 7/60; G01N 21/95607; G01N 21/8851; G01N 2223/6116; G01N 23/2251; G01N 21/9501; G01N 21/8803; G01N 21/8901; G01N 25/72; G01N 33/42; G03F 7/7065; G03F 7/706; G03F 7/70633; G03F 9/7049; A61N 2005/1061; A61N 2005/1087; A61N 5/1049; A61N 5/1064; A61N 5/1067

See application file for complete search history.

(56) References Cited

U.S. PATENT DOCUMENTS

| 8,953,868 | B2 | 2/2015 | Murakami et al. | |
|---|---|---|---|---|
| 2005/0174570 | A1* | 8/2005 | Kvamme | G01N 21/956 356/237.5 |
| 2006/0065645 | A1* | 3/2006 | Nakasu | B23K 26/32 219/121.68 |
| 2011/0133066 | A1* | 6/2011 | Nozoe | H01L 22/12 250/252.1 |
| 2013/0322737 | A1* | 12/2013 | Murakami | G06T 7/001 382/149 |
| 2017/0076435 | A1* | 3/2017 | Park | G01N 21/8851 |
| 2017/0122890 | A1* | 5/2017 | Inoue | H01J 37/28 |

FOREIGN PATENT DOCUMENTS

| KR | 10 2006 0049481 A | 5/2006 |
|---|---|---|
| KR | 10 2017 0049457 A | 5/2017 |
| TW | 201727223 A | 8/2017 |

OTHER PUBLICATIONS

Combined Taiwanese Office Action and Search Report dated May 1, 2020 in corresponding Taiwanese Patent Application No. 107145118 (with English Translation), 18 pages.

Combined Taiwanese Office Action and Search Report dated Oct. 15, 2019 in Taiwanese Patent Application No. 107145118 ((with unedited computer generated English translation), 7 pages.

Korean Final Rejection dated Oct. 15, 2020 in corresponding Korean Patent Application No. 10-2019-0002886 (with English translation), 6 pages.

* cited by examiner

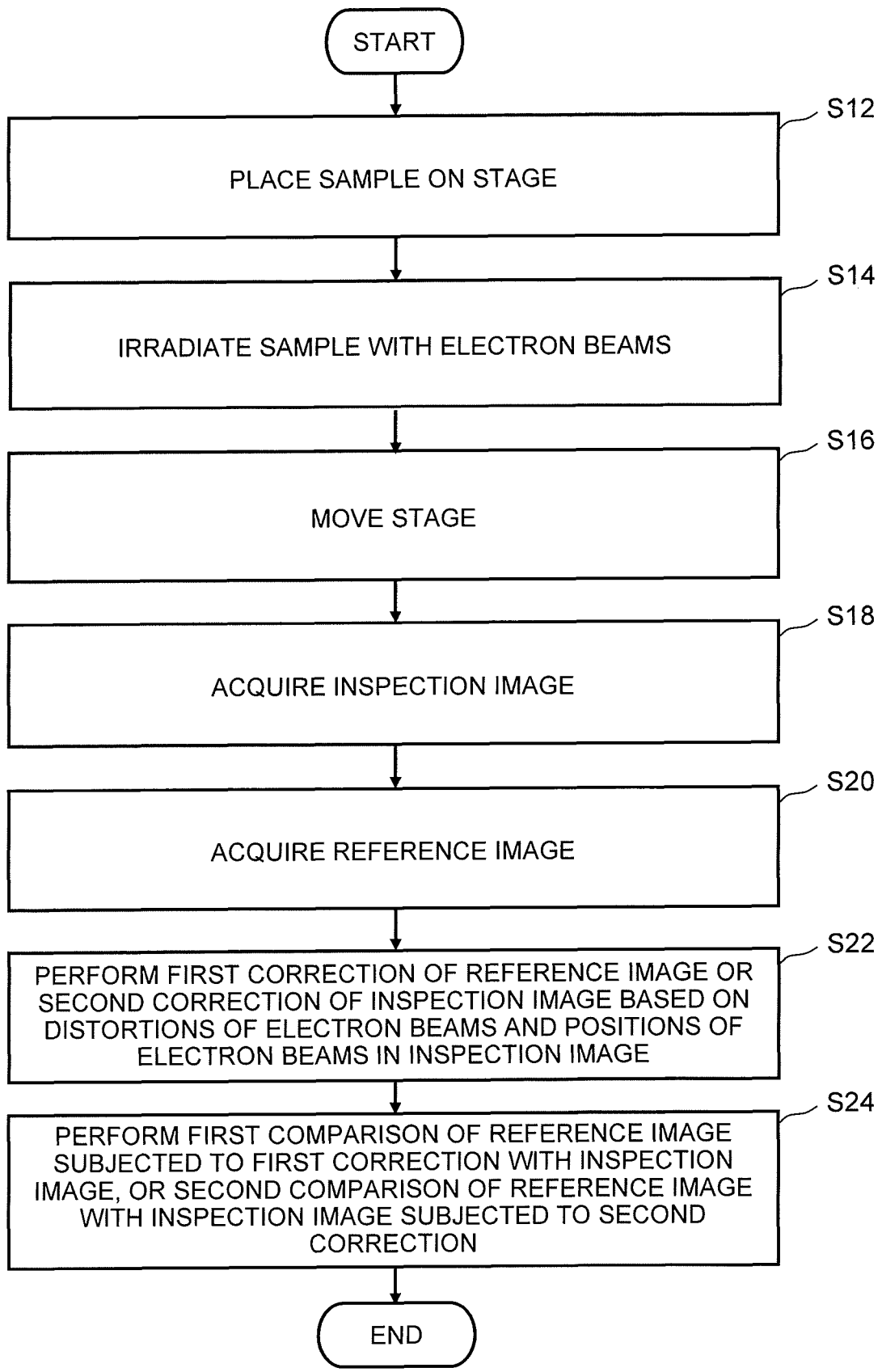

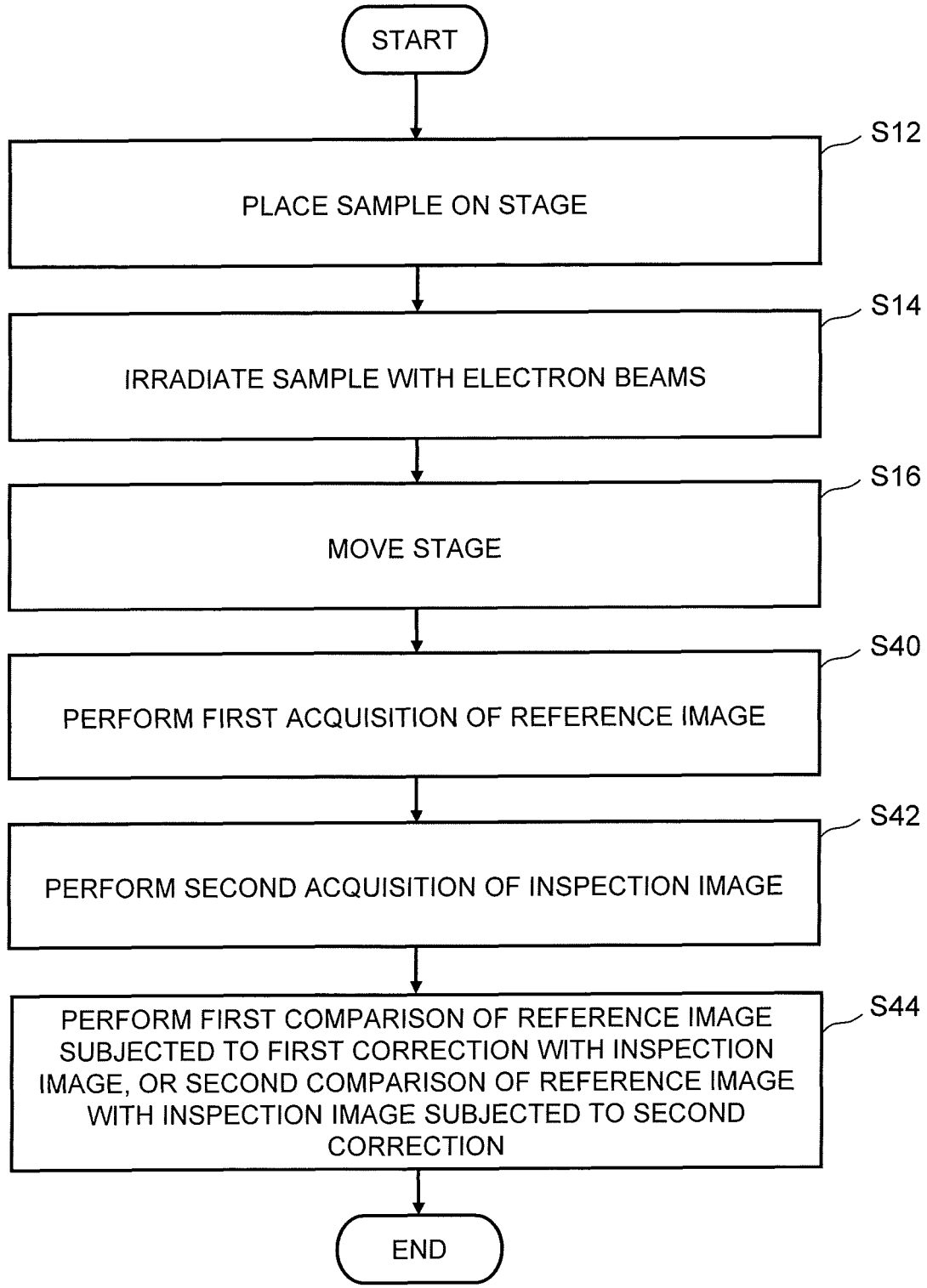

INSPECTION METHOD AND INSPECTION APPARATUS

CROSS-REFERENCE TO RELATED APPLICATION

This application is based upon and claims the benefit of priority from Japanese Patent Applications No. 2018-002386, filed on Jan. 11, 2018, the entire contents of which are incorporated herein by reference.

FIELD OF THE INVENTION

Embodiments described herein relate generally to an inspection method and an inspection apparatus.

BACKGROUND OF THE INVENTION

In recent years, as large-scale integrated circuits (LSI) are highly integrated and have large capacity, the circuit line width required for semiconductor elements has been getting narrower. These semiconductor elements are manufactured using an original image pattern on which a circuit pattern is formed (also referred to as a mask or a reticle, and, hereinafter, collectively referred to as a mask) by exposing and transferring a pattern onto a wafer with a reduction projection exposure apparatus called a stepper to form a circuit.

For manufacturing LSIs requiring large manufacturing costs, it is indispensable to improve yield. However, as represented by 1-gigabit class random access memories (DRAM), patterns constituting LSIs are on the order of submicron to nanometer. In recent years, as the LSI pattern dimension formed on a semiconductor wafer is miniaturized, the dimension to be detected as a pattern defect has been extremely small. Thus, the accuracy of an inspection apparatus that inspects a defect of an ultraminiaturized pattern transferred onto a semiconductor wafer is required to be improved. Besides, one of the major factors for lowering the yield is a pattern defect of a mask used when an ultraminiaturized pattern is exposed and transferred onto a semiconductor wafer by a photolithography technique. Thus, the accuracy of an inspection apparatus that inspects a defect of a transfer mask used for manufacturing LSIs is required to be improved.

There is a known method, as an inspection method, for performing inspection by comparing an optical image obtained by imaging a pattern formed on a sample, such as a wafer including a semiconductor wafer or a mask including a lithography mask, at a predetermined magnification using an enlarging optical system with design data or an optical image obtained by imaging the same pattern of the sample. For example, an inspection method includes a "die-to-die inspection" in which the comparison of optical image data obtained by imaging the same pattern at different positions on the same mask is performed, and a "die-to-database inspection" in which drawing data (design pattern data) obtained by converting pattern-designed CAD data into a device input format for a drawing apparatus to perform input when a pattern is drawn on a mask is input to an inspection apparatus, design image data (reference image) is generated based on the drawing data, and the design image data is compared with an optical image, which is measurement data, obtained by imaging the pattern. In the inspection method in the inspection apparatus, a substrate to be inspected is placed on a stage (sample table), and a light flux scans the sample as the stage moves to perform inspection. The substrate to be inspected is irradiated with a light flux by a light source and an illumination optical system. Light having transmitted through or reflected from the substrate to be inspected is imaged on a sensor via the optical system. The image imaged by the sensor is transmitted as measurement data to a comparator circuit. After the images are aligned with each other, the comparator circuit compares the measurement data with reference data in accordance with an appropriate algorithm and determines that there is a pattern defect when they do not match.

The above inspection apparatus acquires an optical image by irradiating a substrate to be inspected with a laser beam and imaging its transmission image or reflection image. On the other hand, an inspection apparatus that irradiates a substrate to be inspected with a multi-beam constituted by a plurality of electron beams in an array arrangement, in which beams arrayed at the same pitch on a straight line are aligned in rows, and detects secondary electrons corresponding to the respective beams emitted from the substrate to be inspected to obtain a pattern image has been developed. The inspection apparatus using electron beams including a multi-beams scans each small area of a substrate to be inspected to detect secondary electrons.

SUMMARY OF THE INVENTION

An inspection method in an aspect of the present disclosure includes acquiring an inspection image by irradiating a sample with a plurality of electron beams and by simultaneously scanning the sample by the electron beams, performing first correction of a reference image corresponding to the inspection image or second correction of the inspection image based on a plurality of distortions of each of the electron beams and on a position scanned by each of the electron beams in the inspection image, and performing first comparison of the reference image subjected to the first correction with the inspection image or second comparison of the reference image with the inspection image subjected to the second correction.

BRIEF DESCRIPTION OF THE DRAWINGS

FIG. 7 is a flowchart of the first embodiment;

FIG. 9 is a flowchart of the second embodiment.

DETAILED DESCRIPTION OF THE INVENTION

Hereinafter, embodiments of the present disclosure are described with reference to the drawings.

First Embodiment

An inspection method of the present embodiment includes acquiring an inspection image by irradiating a sample with a plurality of electron beams and by simultaneously scanning the sample by the electron beams, performing first correction of a reference image corresponding to the inspection image or second correction of the inspection image based on a plurality of distortions of each of the electron beams and on a position scanned by each of the electron beams in the inspection image, and performing first comparison of the reference image subjected to the first correction with the inspection image or second comparison of the reference image with the inspection image subjected to the second correction.

An inspection apparatus in the present embodiment includes an image acquisition mechanism that acquires an inspection image which is a secondary electron image of a sample by irradiating the sample with a plurality of electron beams and by simultaneously scanning the sample by the electron beams, and an image storage unit that stores the inspection image and a position scanned by each of the electron beams in the inspection image, a distortion storage unit that stores a plurality of distortions of each of the electron beams, an image correction circuit that performs first correction of a reference image corresponding to the inspection image or second correction of the inspection image based on the distortions and the position, and a comparator circuit that performs first comparison of the reference image subjected to the first correction with the inspection image or second comparison of the reference image with the inspection image subjected to the second correction.

Figure 1:
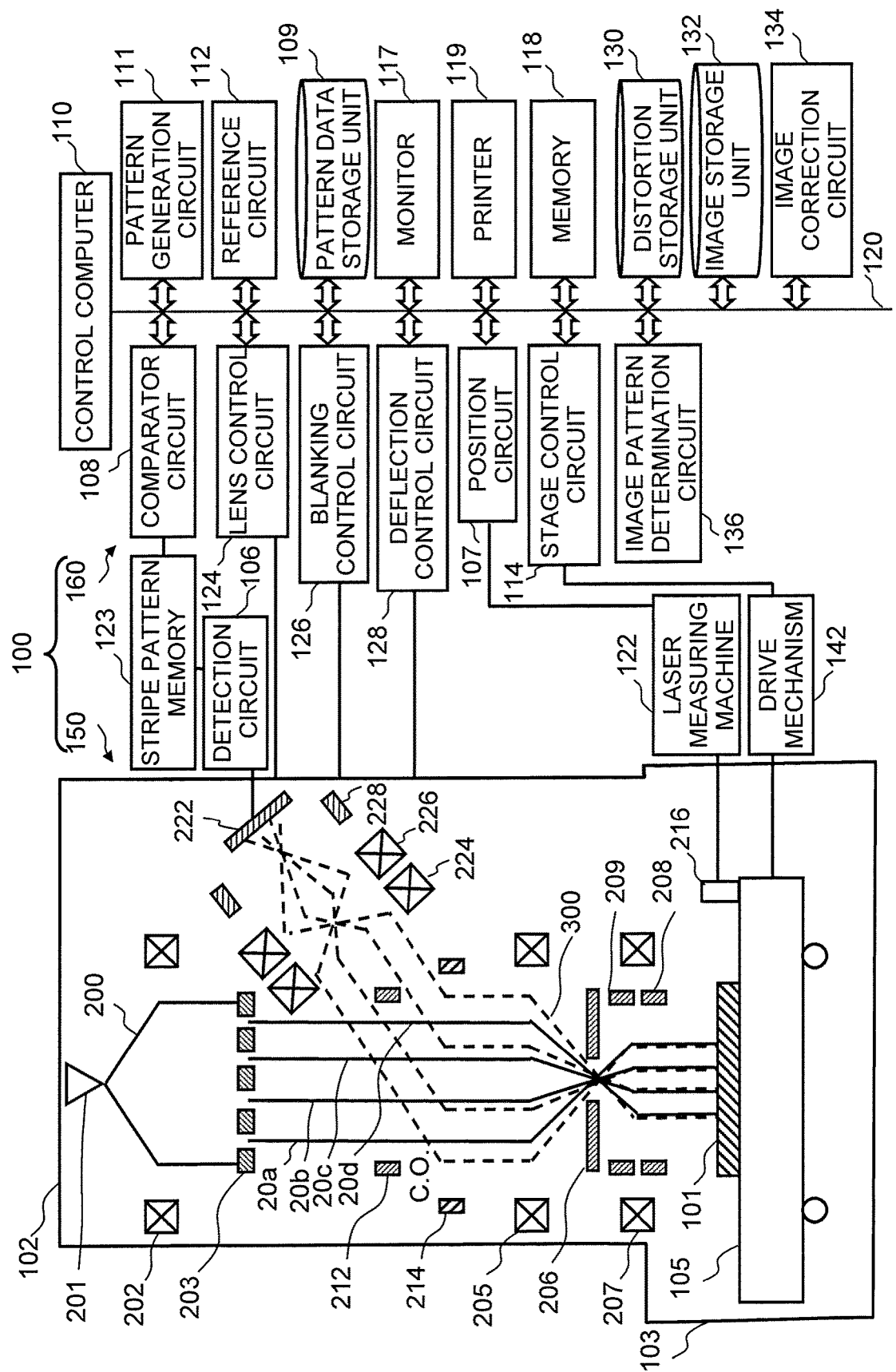
FIG. 1 is a configuration diagram showing a configuration of an inspection apparatus according to a first embodiment.

FIG. 1 is a configuration diagram showing a configuration of an inspection apparatus according to the present embodiment. In FIG. 1, an inspection apparatus 100 that inspects a pattern formed on a substrate is an example of a charged-particle beam inspection apparatus. An electron beam is an example of a charged particle beam. The inspection apparatus 100 includes an electro-optical image acquisition mechanism (image acquisition mechanism, image acquisition circuit) 150 and a control system circuit 160 (control unit). The electro-optical image acquisition mechanism 150 includes an electron beam column 102 (electron lens barrel), an examination chamber 103, a detection circuit 106, a stripe pattern memory 123, a stage drive mechanism 142, and a laser measuring machine 122. In the electron beam column 102, an electron gun 201, an illumination lens 202, a shaping aperture array substrate 203, a reduction lens 205, a limiting aperture substrate 206, an objective lens 207, a main deflector 208, a sub deflector 209, a collective blanking deflector 212, a beam separator 214, projection lenses 224 and 226, a deflector 228, and a multi-detector 222 are disposed.

In the examination chamber 103, an XY stage (sample table) 105 movable at least on an XY plane is disposed. On the XY stage 105, a substrate (sample) 101 on which a chip pattern to be inspected is formed is disposed. The substrate 101 includes a semiconductor substrate such as an exposure mask or a silicon wafer. The substrate 101 is disposed on the XY stage 105 with, for example, a pattern forming surface facing upward. On the XY stage 105, a mirror 216 that reflects a laser beam for measuring the length of a laser emitted from the laser measuring machine 122 disposed outside the examination chamber 103 is disposed. The multi-detector 222 is connected to the detection circuit 106 outside the electron beam column 102. The detection circuit 106 is connected to the stripe pattern memory 123.

In the control system circuit 160, a control computer 110, which is a computer, is connected to, via a bus 120, a position circuit 107, a comparator circuit 108, a generation circuit 111, a reference circuit 112, a stage control circuit 114, a lens control circuit 124, a blanking control circuit 126, a deflection control circuit 128, a distortion storage unit 130, an image storage unit 132, an image correction circuit 134, an image pattern determination circuit 136, a pattern data storage unit 109 such as a magnetic disk device, a monitor 117, a memory 118, and a printer 119. The stripe pattern memory 123 is connected to the comparator circuit 108. The XY stage 105 is driven by the drive mechanism 142 under the control of the stage control circuit 114. In the drive mechanism 142, for example, a drive system, such as a three-axis (X-Y-θ) motor driven in the X direction, the Y direction, and the θ direction, is configured, and the XY stage 105 is movable. For example, step motors can be used for these X motors, Y motors, and θ motors (not shown). The XY stage 105 is movable in the horizontal direction and the rotation direction by motors of X, Y, and θ axes. The moving position of the XY stage 105 is measured by the laser measuring machine 122 and supplied to the position circuit 107. The laser measuring machine 122 receives the reflected light from the mirror 216 to measure the position of the XY stage 105 by the principle of the laser interference method.

The electron gun 201 is connected to a high voltage power supply circuit (not shown), and emits, as an electron beam, electron groups emitted from the cathode and accelerated by application of an acceleration voltage between a filament (not shown) and an extraction electrode (not shown) in the electron gun 201 from the high voltage power supply circuit and by application of a predetermined voltage of the extraction electrode and heating of a predetermined temperature to the cathode (filament). For example, electromagnetic lenses are used for the illumination lens 202, the reduction lens 205, the objective lens 207, and the projection lenses 224 and 226, and are controlled by the lens control circuit 124. The beam separator 214 is also controlled by the lens control circuit 124. The collective blanking deflector 212 and the deflector 228 each are constituted by electrode groups of at least two poles and are controlled by the blanking control circuit 126. The main deflector 208 and the sub deflector 209 each are constituted by electrode groups of at least four poles and are controlled by the deflection control circuit 128.

When the substrate 101 is a semiconductor wafer on which a plurality of chip (die) patterns is formed, pattern data of the chip (die) patterns is input from the outside of the inspection apparatus 100 and stored in the pattern data storage unit 109. When the substrate 101 is an exposure mask, design pattern data, which is a basis for forming a mask pattern on the exposure mask, is input from the outside of the inspection apparatus 100 and stored in the pattern data storage unit 109.

Here, FIG. 1 shows the constituent elements necessary for explaining the first embodiment. The inspection apparatus 100 may have other necessary constituent elements in general.

Figure 2:
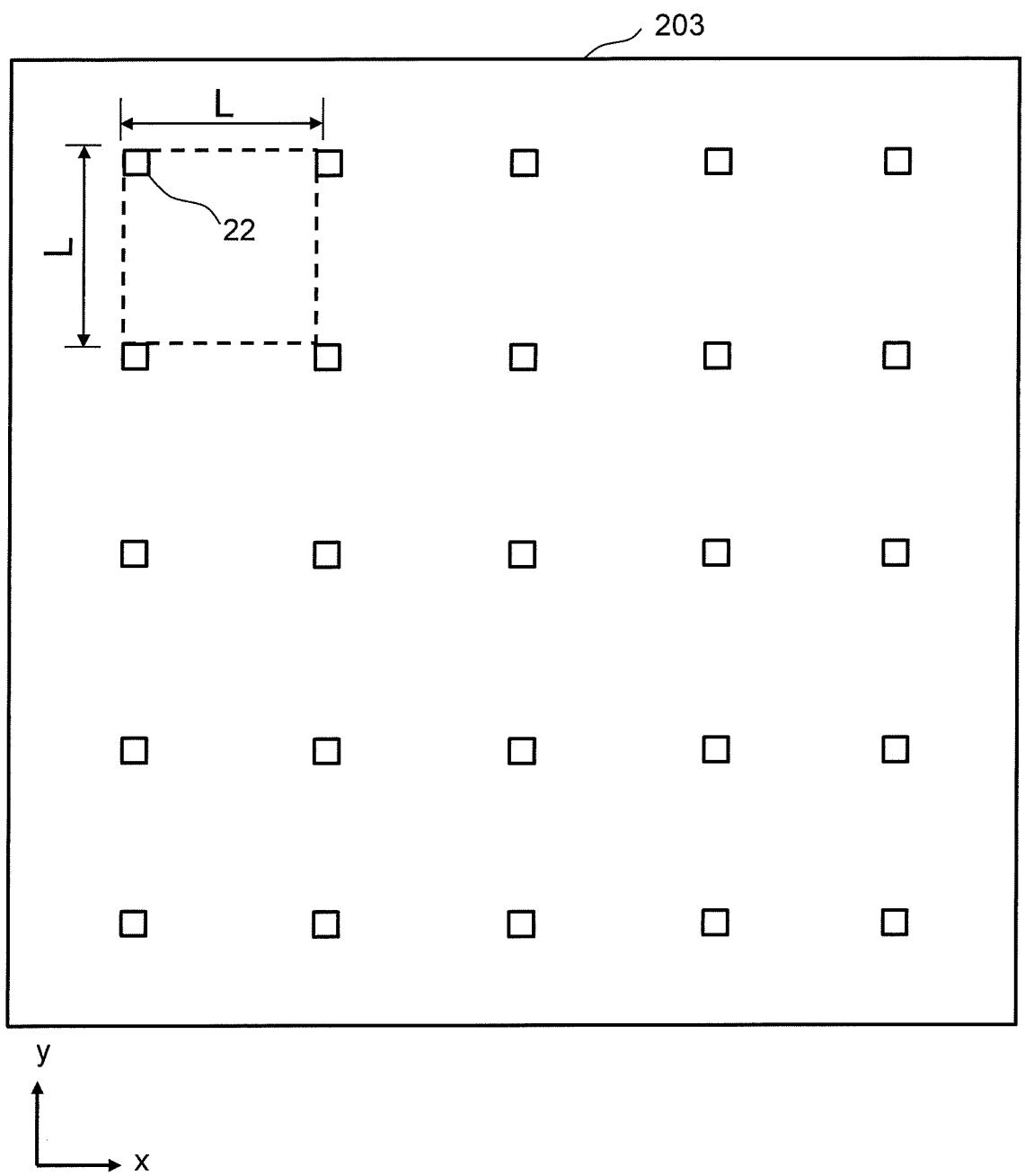
FIG. 2 is a schematic diagram showing a configuration of a shaping aperture array member according to the first embodiment.

FIG. 2 is a schematic diagram showing a configuration of a shaping aperture array member according to the first embodiment. In FIG. 2, the shaping aperture array substrate 203 is provided with two-dimensional (matrix) N (X direction)×N' (Y direction) holes (openings) 22 formed at a predetermined arrangement pitch L in the X and Y directions, where N is an integer of 2 or more, N' is an integer of 1 or more, the X direction is the horizontal direction to be referred to as a first direction, and the y direction is the vertical direction to be referred to as a second direction. When the reduction magnification of the multi-beam is "a" (when the multi-beam diameter is reduced to 1/a to irradiate the substrate 101), and the pitch between multi-beams in the X and Y directions on the substrate 101 is set to "p", the arrangement pitch L is L=(a×p). In the example of FIG. 2, the holes 22 for forming N=5×N'=5 (5×5) multi-beams are formed. Next, the movement of the electro-optical image acquisition mechanism 150 in the inspection apparatus 100 is described.

Figure 3:
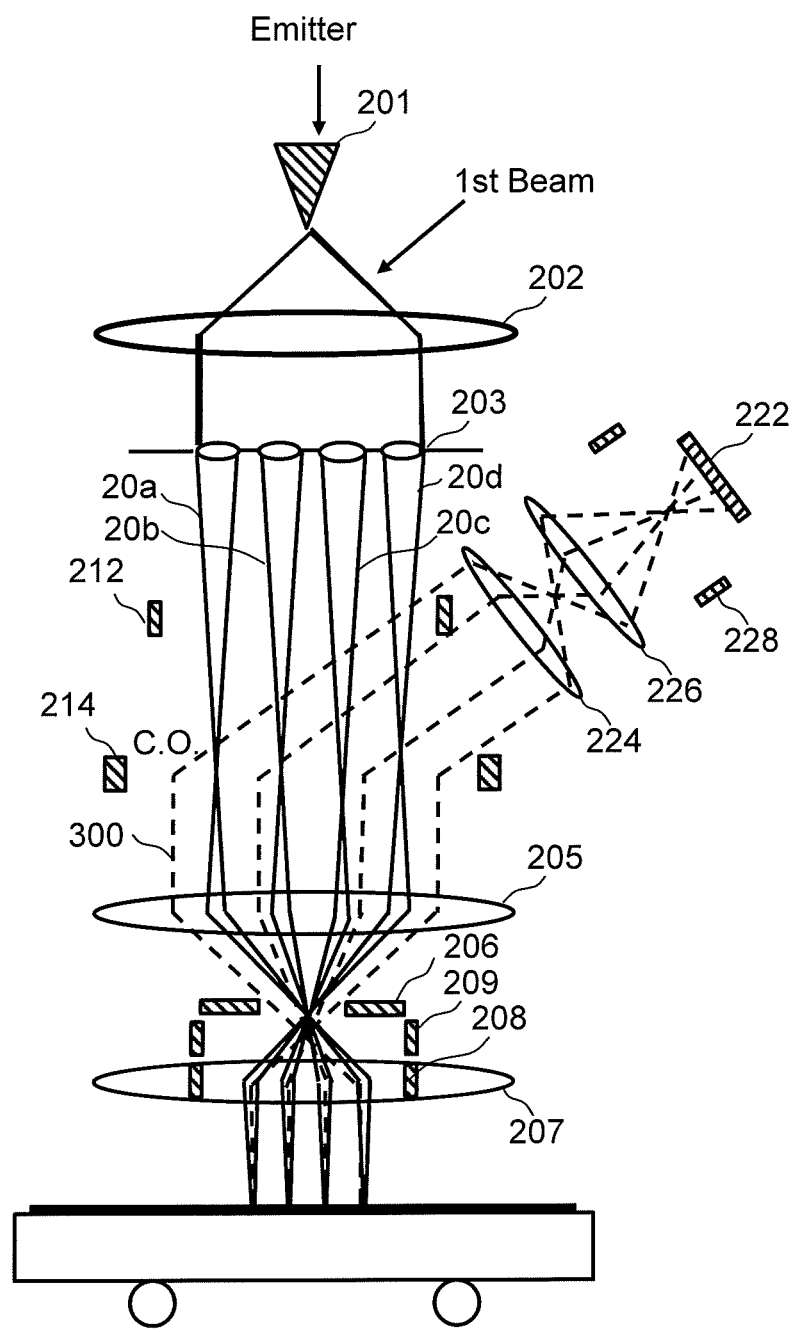
FIG. 3 is a view for explaining a path of a beam in the inspection apparatus according to the first embodiment.

FIG. 3 is a view for explaining a path of a beam in the inspection apparatus according to the first embodiment. An electron beam 200 emitted from the electron gun 201 (emission source) substantially vertically illuminates the entire shaping aperture array substrate 203 by the illumination lens 202. As shown in FIG. 2, a plurality of rectangular holes 22 (openings) are formed in the shaping aperture array substrate 203, and the electron beam 200 illuminates an area including all of the holes 22. A part of the electron beam 200 with which the position of each of the holes 22 is irradiated passes through each of the holes 22 of the shaping aperture array substrate 203, and a plurality of, for example, rectangular or circular shaped electron beams (multi-beams) (a plurality of electron beams) 20a to 20d (solid lines in FIGS. 1 and 3) are formed.

Then, the formed multi-beams 20a to 20d form crossovers (C.O.), pass through the beam separator 214 disposed at a crossover position of the multi-beams 20, are reduced by the reduction lens 205, and travel toward the center hole formed in the limiting aperture substrate 206. Here, when the whole of the multi-beams 20a to 20d are collectively deflected by the collective blanking deflector 212 disposed between the shaping aperture array substrate 203 and the reduction lens 205, the multi-beams 20a to 20d are deviated from the position of the center hole of the limiting aperture substrate 206, and are shielded by the limiting aperture substrate 206. On the other hand, the multi-beams 20a to 20d not deflected by the collective blanking deflector 212 pass through the center hole of the limiting aperture substrate 206 as shown in FIG. 1. Blanking control is performed by turning on/off the collective blanking deflector 212, and beam ON/OFF is collectively controlled. In this manner, the limiting aperture substrate 206 shields the multi-beams 20a to 20d deflected by the collective blanking deflector 212 so as to be in the beam OFF state. The multi-beams 20a to 20d are formed with the groups of beams formed from the beam ON state until the beam OFF state and having passed through the limiting aperture substrate 206. The multi-beams 20a to 20d having passed through the limiting aperture substrate 206 are focused by the objective lens 207 to be a pattern image (beam diameter) with a desired reduction ratio. Then, the whole of the multi-beams 20a to 20d having passed through the limiting aperture substrate 206 are collectively deflected by the main deflector 208 and the sub deflector 209 in the same direction to irradiate the corresponding irradiation position of each beam on the substrate 101. At this time, the whole of the multi-beams 20 are collectively deflected by the main deflector 208 so as to irradiate respective reference positions of unit inspection areas to be scanned by each beam, which are to be described later, and tracking deflection is also performed to follow the movement of the XY stage 105. Then, the whole of the multi-beams 20 are collectively deflected by the sub deflector 209 so that the beams scan corresponding N×N' sub-areas (grids 29 to be described later) in the unit inspection area. Ideally, the multi-beams 20 to be emitted at a time are arranged at a pitch obtained by multiplying the arrangement pitch L (=ap) of the holes 22 of the shaping aperture array substrate 203 by the above desired reduction ratio (1/a). In this manner, the electron beam column 102 irradiates the substrate 101 with the two-dimensional N×N' multi-beams 20 at a time. A bundle of secondary electrons (multi secondary electrons 300) corresponding to each of the multi-beams 20 is emitted from the substrate 101 (see dotted lines in FIGS. 1 and 3) due to the irradiation of desired positions on the substrate 101 with the multi-beams 20.

The multi secondary electrons 300 emitted from the substrate 101 are refracted to the center side of the multi secondary electrons 300 by the objective lens 207 and travel toward the center hole formed in the limiting aperture substrate 206. The multi secondary electrons 300 having passed through the limiting aperture substrate 206 are refracted in the direction substantially parallel to the optical axis by the reduction lens 205 and travel to the beam separator 214.

Here, the beam separator 214 generates an electric field and a magnetic field in directions orthogonal to each other on a plane orthogonal to the traveling direction (optical axis) of the multi-beams 20. The electric field exerts a force in the same direction regardless of the traveling direction of electrons. In contrast, the magnetic field exerts a force in accordance with the Fleming's left-hand rule. Thus, it is possible to change the direction of the force acting on electrons depending on the entering direction of electrons. The force from the electric field and the force from the magnetic field cancel each other in the multi-beams 20 (primary electron beam) entering the beam separator 214 from the upper side, and the multi-beams 20 travel straight downward. On the other hand, the force from the electric field and the force from the magnetic field both work in the same direction in the multi secondary electrons 300 entering the beam separator 214 from the lower side, and the multi secondary electrons 300 are bent obliquely upward.

The multi secondary electrons 300 bent obliquely upward are refracted by the projection lenses 224 and 226, and projected onto the multi-detector 222. The multi-detector 222 detects the projected multi secondary electrons 300. The multi-detector 222 includes a diode type two-dimensional sensor (not shown). Then, at the position of the diode-type two-dimensional sensor corresponding to each of the multi-beams 20, each secondary electron of the multi secondary electrons 300 collides with the diode-type two-dimensional sensor and generates electrons, and secondary electron image data is generated for each pixel to be described later. When the multi-detector 222 does not detect the multi secondary electrons 300, the multi secondary electrons 300 are blanking-deflected by the deflector 228 so that the multi secondary electrons 300 do not reach the light receiving surface.

Figure 4A:
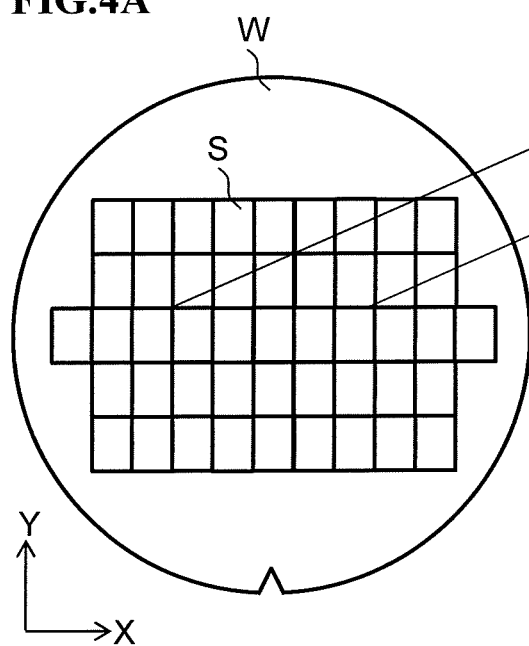
FIGS. 4A to 4C are schematic diagrams showing a method for acquiring an inspection image of a pattern on a wafer according to the first embodiment.
Figure 4B:
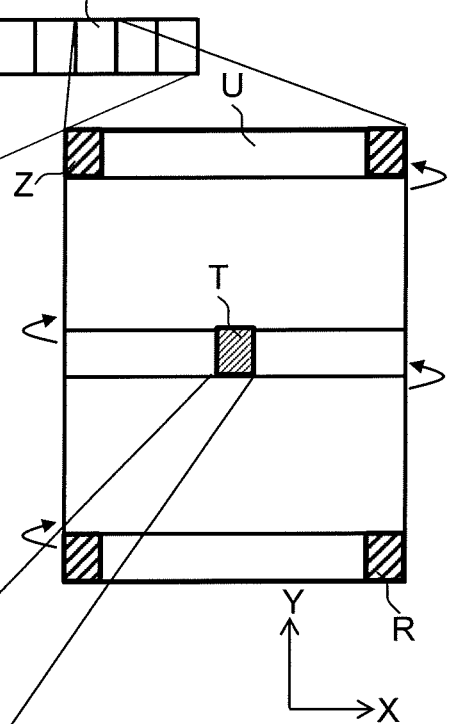
Figure 4C:
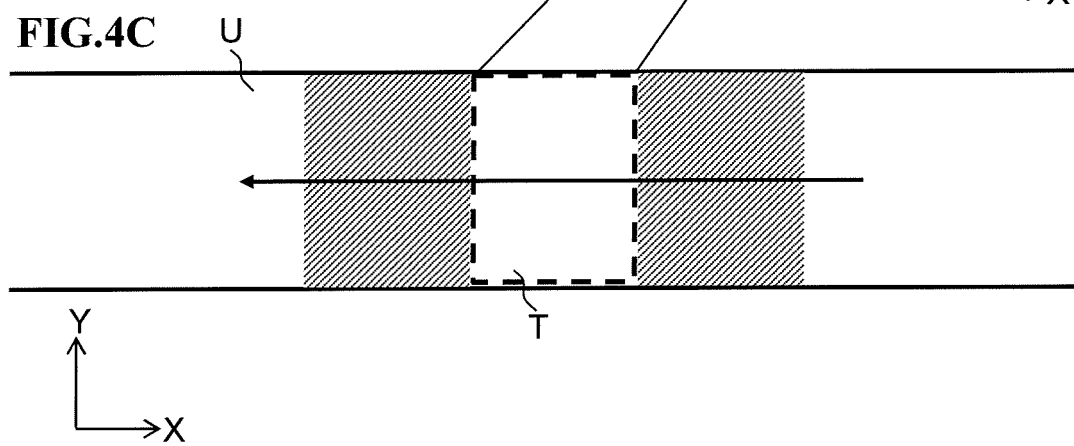

FIGS. 4A to 4C are schematic diagrams showing a method for acquiring an inspection image of a pattern on a wafer according to the present embodiment.

FIG. 4A is a schematic diagram showing that a plurality of shots S is formed on a wafer W. In each of the shots S, a pattern to be inspected by the inspection apparatus 100 is formed. Each of the shots S is formed by one exposure using, for example, a mask, but may be formed by a plurality of exposures.

FIG. 4B is a schematic diagram showing how an inspection die D is scanned by the multi-beams 20. FIG. 4B shows an inspection end area Z, an inspection stripe U, a beam scan area (inspection image acquisition area) T, and an inspection start area R.

FIG. 4C is a schematic diagram showing the movement of the wafer W in the inspection stripe U. The inspection stripe U (wafer W) is moved so as to cross the beam scan area T.

Figure 5:
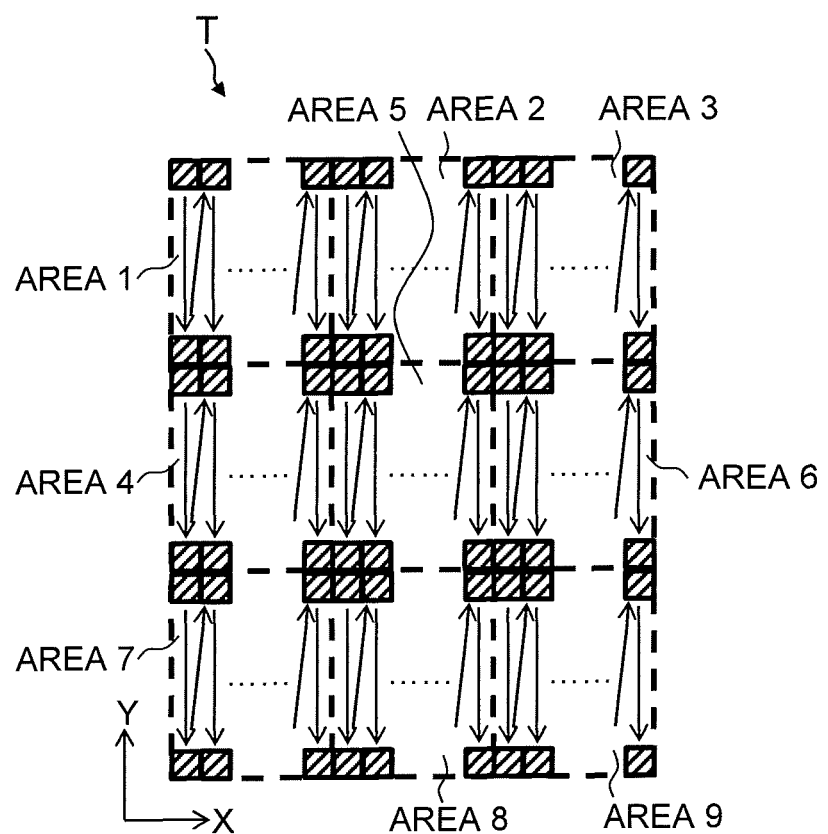
FIG. 5 is a schematic diagram showing how a beam scan area (inspection image acquisition area) is irradiated with a plurality of electron beams according to the first embodiment.

FIG. 5 is a schematic diagram showing how the beam scan area T (inspection image acquisition area) is irradiated with a plurality of electron beams (multi-beams 20) according to the present embodiment. It is assumed that the holes 22 for forming nine (3×3) multi-beams are formed in the shaping aperture array substrate 203 (FIG. 2).

In order to inspect a pattern, the inspection die D to be inspected is scanned by the multi-beams 20. The beam scan area (inspection image acquisition area) T in the inspection die D is irradiated with the multi-beams 20. At this time, the wafer W is moved in, for example, a direction opposite to the X direction so as to cross the beam scan area T (see FIG. 4C). By moving the multi-beams 20 in the Y direction and in the direction opposite to the Y direction together with the movement of the wafer W, the entire beam scan area T is scanned to acquire an inspection image of the beam scan area T.

The above operation is performed to acquire an inspection image in the inspection stripe U. When the inspection in the inspection stripe U is completed, the wafer W is moved in the Y direction by the length of the inspection stripe U in the Y direction, and the wafer W is moved in the X direction to further acquire the inspection image. This continues until the beam scan area T crosses the inspection end area from the inspection start area to acquire the entire inspection image in the inspection die D.

FIG. 4B shows that the size of the inspection die D is equal to the size of the shot S, but, for example, a plurality of inspection dies D may be formed in the shot S.

Figure 6A:
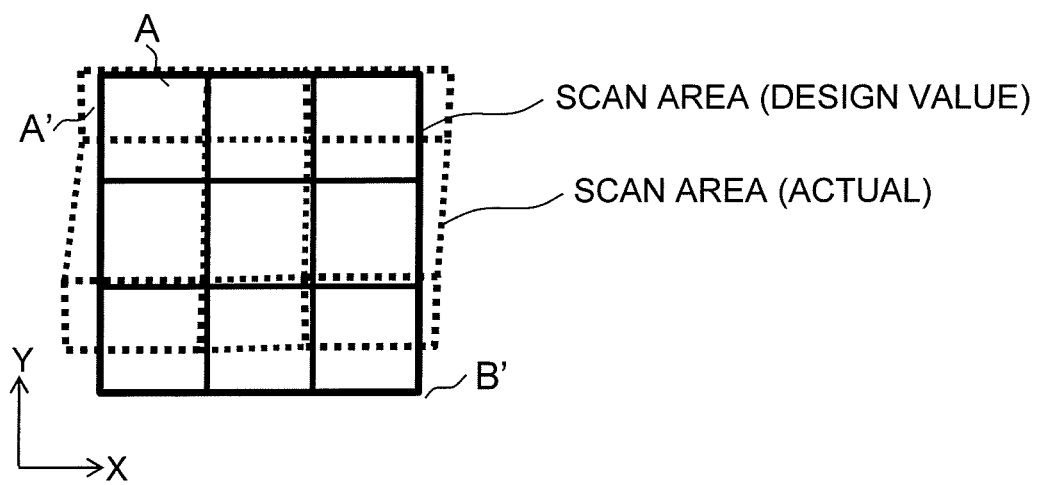
FIGS. 6A and 6B are schematic diagrams of inspection images acquired under the influence of a distortion relating to a position of each electron beam in the beam scan area (inspection image acquisition area) according to the first embodiment.
Figure 6B:
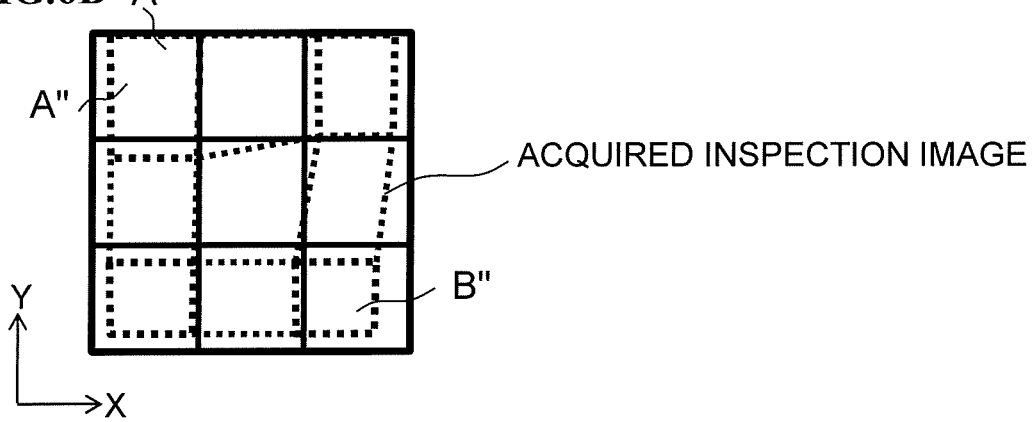

FIGS. 6A and 6B are schematic diagrams of inspection images acquired under the influence of a distortion relating to the position of each of the electron beams in the beam scan area T according to the present embodiment.

FIG. 6A is a schematic diagram showing how an area (scan area) to be scanned by each of the electron beams is changed under the influence of a distortion relating to the position of each of the electron beams.

There is optical aberration in the optical system through which the electron beams pass. Due to this optical aberration, each of the electron beams has a distortion. An example of the distortion is a distortion relating to a position. The distortion relating to a position is that a position on the wafer W which is deviated from the design is irradiated with an electron beam. Although the scan area indicated by the solid line in FIG. 6A is designed to be scanned, the area indicated by the dotted line is scanned due to the distortion relating to a position.

FIG. 6B is a schematic diagram of an inspection image acquired under the influence of the distortion relating to the position of each electron beam. Although the inspection image corresponding to the scan area indicated by the solid line is designed to be acquired, the image indicated by the dotted line is acquired due to the distortion relating to the position. For example, when an area A' having a rectangular shape elongate in the X direction as shown in FIG. 6A is scanned by the electron beam corresponding to an area A, the corresponding inspection image is acquired as an image A" having a shape in which a square is distorted to be elongate in the Y direction. When an area B' which is larger in both the X direction and the Y direction than the design as shown in FIG. 6A is scanned by the electron beam corresponding to an area B, the corresponding inspection image is acquired as an image B" which is smaller in both the X direction and the Y direction than the design.

Furthermore, due to the distortion relating to the position, a defect to be detected by the electron beam corresponding to a specific area can be detected by a different electron beam.

Distortions of electron beams include a distortion of beam brightness, a distortion of beam shape, and a distortion of beam blur. The distortion of beam brightness means, for example, that the brightness of each electron beam is different. If defects are the same size, the defects will be detected to be smaller when detected with a dark electron beam than with a bright electron beam.

The distortion of beam shape means, for example, that the shape of an electron beam on the surface of the wafer W is a circle whereas the shape of another electron beam is elliptical.

The distortion of beam blur means that a specific electron beam is focused on the surface of the wafer W, whereas another electron beam is not focused on the surface of the wafer W.

FIG. 7 is a flowchart of an inspection method according to the present embodiment.

First, a wafer W to be inspected (substrate 101) on which a pattern is formed is placed on the XY stage 105 (S12).

Next, the beam scan area T of the wafer W is irradiated with the multi-beams 20 constituted by a plurality of electron beams (S14).

While the beam scan area T is being irradiated with the multi-beams 20, the XY stage 105 is moved so that the inspection stripe U of the wafer W passes through the beam scan area T (S16), and an inspection image is acquired (S18). The acquired inspection image is stored in, for example, the image storage unit 132.

"The position scanned by each of the electron beams in the inspection image" is described with reference to FIG. 5 as an example. In FIG. 5, inspection images of an area 1, an area 2, an area 3, an area 4, an area 5, an area 6, an area 7, an area 8, and an area 9 are acquired using nine multi-beams in total. "The position scanned by each of the electron beams in the inspection image" means which area of the inspection image is acquired by which electron beam among the electron beams. "The position scanned by each of the electron beams in the inspection image" is also stored in the image storage unit 132 together with the acquired inspection image.

Next, a reference image is acquired (S20). The pattern data for creating the reference image is stored in the pattern data storage unit 109. Thus, the control computer 110 reads the pattern data from the pattern data storage unit 109, generates the pattern data using the generation circuit 111, and creates the reference image using the reference circuit 112. The reference image acquired in this manner is stored in, for example, the image storage unit 132.

Next, using the image correction circuit 134, the control computer 110 performs first correction of the reference image corresponding to the inspection image or second correction of the inspection image, based on a plurality of distortions of each of the electron beams and the position scanned by each of the electron beams in the inspection image (S22). The distortions of each of the electron beams are measured in advance and stored in the distortion storage unit 130.

Next, the control computer 110 performs, using the comparator circuit 108, first comparison of the reference image subjected to the first correction with the inspection image, or second comparison of the reference image with the inspection image subjected to the second correction (S24).

Next, the effects of the present embodiment are described.

As a semiconductor pattern is miniaturized, there is a demand for an inspection apparatus and an inspection method capable of simultaneously scanning an area with a plurality of electron beams having high inspection resolution disposed in a matrix, and of simultaneously acquiring an inspection image having a plurality of patterns.

Here, each of the electron beams has distortions such as a distortion relating to a position, a distortion of beam brightness, a distortion of beam shape, and a distortion of beam blur. Thus, the acquired inspection image is changed due to the distortions. On the other hand, in a reference image created from pattern data, the image is not assumed to be changed due to such distortions of electron beams. For this reason, the distortions of electron beams cause a problem in inspecting and comparing the inspection image and the reference image.

According to the inspection method in the present embodiment, it is possible to correct the reference image or the inspection image based on which portion of the inspection image is acquired by which electron beam and on the distortions of electron beams. Accordingly, it is possible to provide an inspection method capable of suppressing erroneous detection of defects.

By calculating the positions, in the inspection image, of the electron beams used for the acquisition based on the coordinates of the stage on which the sample is placed, it is possible to associate the electron beams used for the acquisition with the inspection image.

According to the inspection method in the present embodiment, it is possible to provide an inspection method capable of suppressing erroneous detection of defects.

Second Embodiment

An inspection method in the present embodiment includes performing first acquisition of a reference image by irradiating a first area having a first pattern of a sample with a plurality of electron beams and by simultaneously scanning the first area by the electron beams, performing second acquisition of an inspection image by irradiating a second area having a second pattern of the sample with the electron beams such that a same pattern portion of the second pattern as the first pattern is irradiated with a same electron beam among the electron beams and by simultaneously scanning the second area by the electron beams, and comparing the reference image with the inspection image.

An inspection apparatus in the present embodiment includes image acquisition mechanism that performs first acquisition of a reference image by irradiating a first area having a first pattern of a sample with a plurality of electron beams and by simultaneously scanning the first area by the electron beams, and performs second acquisition of an inspection image by irradiating a second area having a second pattern of the sample with the electron beams such that a same pattern portion of the second pattern as the first pattern is irradiated with a same electron beam among the electron beams and by simultaneously scanning the second area by the electron beams, and a comparator circuit that compares the reference image with the inspection image.

The description overlapping with the first embodiment is omitted.

The inspection method in the present embodiment is a die-to-die inspection method.

Figure 8:
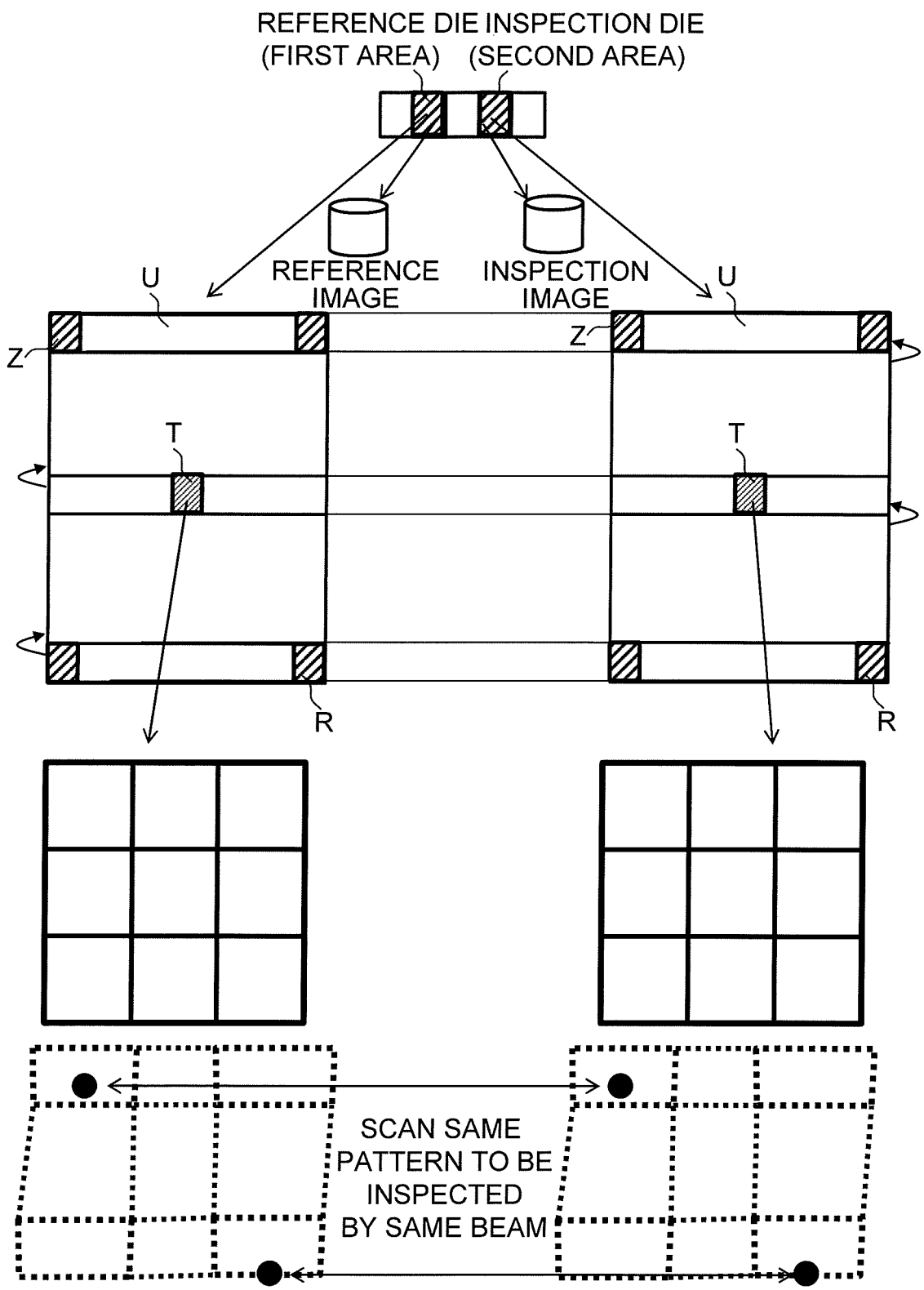
FIG. 8 is a schematic diagram for explaining the outline of an inspection method according to a second embodiment.

FIG. 8 is a schematic diagram for explaining the outline of the inspection method in the present embodiment.

The inspection method in the present embodiment is a die-to-die inspection method. Thus, a reference image is acquired by irradiating a reference die (first area) with a plurality of electron beams. In addition, an inspection image is acquired by irradiating an inspection die (second area) with a plurality of electron beams. Then, by comparing the reference image with the inspection image, inspection is performed.

Here, in order to perform the comparison, it is necessary that the same pattern is included in the reference image and the inspection image. In addition, in order to eliminate the influence of distortions of electron beams, it is preferable that the same pattern is scanned by the same electron beam. Thus, the same pattern portion of the inspection die as the pattern of the reference die is to be irradiated with the same electron beam.

FIG. 9 is a flowchart of the inspection method in the present embodiment.

After (S16), first acquisition of a reference image is performed by irradiating a first area having a first pattern of a sample with a plurality of electron beams and by simultaneously scanning the first area by the electron beams (S40). The reference image and the position scanned by each of the electron beams in the reference image are stored in an image storage unit 132.

Next, second acquisition of an inspection image is performed by irradiating a second area having a second pattern with a plurality of electron beams so that the same pattern portion of the second pattern as the first pattern is irradiated with the same electron beam among the electron beams and by simultaneously scanning the second area by the electron beams (S42). The inspection image and the position scanned by each of the electron beams in the inspection image are stored in the image storage unit 132.

Here, the second acquisition of the inspection image may be performed so that the same pattern portion of the second pattern as the first pattern is irradiated with the same electron beams among the electron beams based on the coordinates of a stage on which the sample is placed.

An image pattern determination circuit 136 is used to irradiate the same pattern portion of the second pattern as in the first pattern with the same electron beam among the electron beams. The image pattern determination circuit 136 finds the same pattern portion by, for example, comparing the reference image with the inspection image. Next, the image pattern determination circuit 136 confirms whether the same pattern portion of the reference image and the same pattern portion of the inspection image are irradiated with the same electron beam. The function of the image pattern determination circuit 136 is not limited to this.

Note that, the second acquisition of the inspection image may be performed first, and, then, the first acquisition of the reference image may be performed.

Next, the reference image is compared with the inspection image (S44).

Before the reference image is compared with the inspection image, an image correction circuit 134 may perform first correction of the reference image and second correction of the inspection image based on the position scanned by each of the electron beams in the reference image and the position scanned by each of the electron beams in the inspection image.

Next, the effects of the present embodiment are described.

In a die-to-die inspection, it is possible to provide an inspection method capable of suppressing false detection of defects by performing inspection taking distortions of electron beams into account.

In the die-to-die inspection, by irradiating the same pattern portion with the same electron beam, it is possible to easily perform inspection without correction due to distortions unlike a die-to-database inspection.

On the other hand, since the same pattern portions in the reference image and in the inspection image are compared in the die-to-die inspection, the image pattern determination circuit 136 is used to compare the same pattern portions irradiated with the same electron beam among a plurality of electron beams between the inspection image and the reference image. Accordingly, it is possible to provide an inspection method capable of suppressing false detection of defects in the die-to-die inspection.

Naturally, it is possible to perform a more accurate inspection in the die-to-die inspection by correcting distortions of electron beams. In particular, by correcting the distortion of beam brightness, it is possible to easily compare the sizes of defects included in the inspection image acquired with each electron beam.

In the above description, a series of "mechanisms" or "circuits" includes a processing circuit, and the processing circuit includes an electric circuit, a computer, a processor, a circuit board, a quantum circuit, a semiconductor device, or the like. In addition, "circuits" may be a common processing circuit (same processing circuit). Alternatively, "circuits" may be different processing circuits (separate processing circuits). A program for executing a processor or the like may be recorded in a recording medium such as a magnetic disk device, a magnetic tape device, an FD, or a read only memory (ROM). In addition, "recording units", "storage units" or recording devices include a recording medium such as a magnetic disk device, a magnetic tape device, an FD, a read only memory (ROM), or a solid state drive (SSD).

The embodiments of the present disclosure have been described with reference to specific examples. The above embodiments are merely described as examples, and do not limit the present disclosure. In addition, the constituent elements of each embodiment may be appropriately combined.

For example, the inspection of a pattern formed on a wafer W has been described as an example in the embodiments, but the inspection of a pattern formed on a mask can also be preferably described.

In the embodiments, the descriptions which are not directly necessary for the explanation of the present disclosure, such as the configurations of the inspection method and the inspection apparatus, and its manufacturing method, are omitted, but the configuration of the necessary inspection method can be appropriately selected and used. In addition, all inspection methods that include the elements of the present disclosure and can be appropriately designed and changed by those skilled in the art are included in the scope of the present disclosure. The scope of the present disclosure is defined by the scope of the claims and their equivalents.

What is claimed is:

1. An inspection method, comprising:
   acquiring an inspection image by irradiating beam scan areas in a sample with a plurality of electron beams and by simultaneously scanning each of the beam scan areas by each of the electron beams among the plurality of electron beams, the acquiring occurring in a single inspection apparatus;
   performing a first correction of a reference image corresponding to said each of the beam scan areas, the first correction being based on a plurality of distortions among said each of the electron beams and on which portion of the reference image is acquired by which electron beam among said plurality of electron beams; and
   performing first comparison of the reference image subjected to the first correction with the inspection image.

2. The inspection method according to claim 1, wherein a position scanned by each of the electron beams in the inspection image is obtained based on coordinates of a sample table on which the sample is placed.

3. The inspection method according to claim 1, wherein the distortions are a distortion relating to a position, a distortion of beam brightness, a distortion of beam shape, or a distortion of beam blur.

4. An inspection method, comprising:
   performing first acquisition of a reference image by irradiating a first beam scan area having a first pattern in a sample with a plurality of electron beams and by simultaneously scanning the first beam scan area by each of the electron beams among the plurality of electron beams, the first acquisition occurring in a single inspection apparatus;
   performing second acquisition of an inspection image by irradiating a second beam scan area having a second pattern in the sample with the plurality of the electron beams such that a same pattern portion of the second pattern as the first pattern is irradiated with a same electron beam among the electron plurality of the beams and by simultaneously scanning the second area by said each of the electron beams among the plurality of electron beams, the second acquisition occurring in the single inspection apparatus; and
   comparing the reference image with the inspection image.

5. The inspection method according to claim 4, further comprising:
   performing the second acquisition of the inspection image such that the same pattern portion of the second pattern as the first pattern is irradiated with the same electron beam among the electron beams based on coordinates of a sample table on which the sample is placed.

6. The inspection method according to claim 4, further comprising:
   performing a first correction of the reference image and a second correction of the inspection image based on a plurality of distortions among said each of the electron beams and on which portions of the reference image and the inspection image are acquired by which electron beam among said plurality of electron beams, on a position scanned by said each of the electron beams in the reference image, and on a position scanned by said each of the electron beams in the inspection image.

7. The inspection method according to claim 6, wherein the distortions are a distortion relating to a position, a distortion of beam brightness, a distortion of beam shape, or a distortion of beam blur.

8. An inspection apparatus, comprising:
   an image acquisition circuit configured to perform a first acquisition of a reference image by irradiating a first beam scan area having a first pattern in a sample with a plurality of electron beams and by simultaneously scanning the first beam scan area by each of the electron beams among the plurality of electron beams, the first acquisition occurring in a single inspection apparatus, and to perform a second acquisition of an inspection image by irradiating a second beam scan area having a second pattern in the sample with the plurality of the electron beams such that a same pattern portion of the second pattern as the first pattern is irradiated with a same electron beam among the plurality of the electron beams and by simultaneously scanning the second area by the plurality of the electron beams, the first and the second acquisitions occurring in the inspection apparatus; and a comparator circuit configured to compare the reference image with the inspection image.

9. The inspection apparatus according to claim 8, further comprising:

an image pattern determination circuit configured to find the same pattern portion of the second pattern as the first pattern by comparing the reference image with the inspection image and to confirm whether the same pattern portion of the reference image and the same pattern portion of the inspection image are irradiated with the same electron beam among the electron beams.

10. The inspection apparatus according to claim 8, wherein the image acquisition circuit performs the second acquisition of the inspection image such that the same pattern portion of the second pattern as the first pattern is irradiated with the same electron beam among the electron beams based on coordinates of a sample table on which the sample is placed.

11. The inspection apparatus according to claim 8, further comprising:

an image correction circuit configured to perform a first correction of the reference image and a second correction of the inspection image based on a plurality of distortions among said each of the electron beams and on which portions of the reference image and the inspection image are acquired by which electron beam among said plurality of electron beams, on a position scanned by said each of the electron beams in the reference image, and on a position scanned by said each of the electron beams in the inspection image.

12. The inspection apparatus according to claim 11, wherein the distortions are a distortion relating to a position, a distortion of beam brightness, a distortion of beam shape, or a distortion of beam blur.

* * * * *